United States Patent
Tasaki et al.

(10) Patent No.: US 12,270,977 B2
(45) Date of Patent: Apr. 8, 2025

(54) ULTRAVIOLET LED OPTICAL MEMBER

(71) Applicant: ASAHI RUBBER INC., Saitama (JP)

(72) Inventors: Masutugu Tasaki, Saitama (JP); Yuta Ito, Saitama (JP); Takeru Kawaguchi, Saitama (JP); Nobuyuki Tomizawa, Saitama (JP)

(73) Assignee: ASAHI RUBBER INC., Saitama (JP)

( * ) Notice: Subject to any disclaimer, the term of this patent is extended or adjusted under 35 U.S.C. 154(b) by 244 days.

(21) Appl. No.: 18/011,681

(22) PCT Filed: Sep. 17, 2021

(86) PCT No.: PCT/JP2021/034382
§ 371 (c)(1),
(2) Date: Dec. 20, 2022

(87) PCT Pub. No.: WO2022/075048
PCT Pub. Date: Apr. 14, 2022

(65) Prior Publication Data
US 2023/0251477 A1 Aug. 10, 2023

(30) Foreign Application Priority Data
Oct. 5, 2020 (JP) .................. 2020-168700

(51) Int. Cl.
*G02B 19/00* (2006.01)
*G02B 3/08* (2006.01)

(52) U.S. Cl.
CPC ........... *G02B 19/0061* (2013.01); *G02B 3/08* (2013.01)

(58) Field of Classification Search
CPC ........ G02B 19/0061; G02B 3/08; G02B 1/14; G02B 3/00; C08J 5/18; H01L 33/58; F21V 5/00
See application file for complete search history.

(56) References Cited

U.S. PATENT DOCUMENTS

2007/0267645 A1* 11/2007 Nakata ............... H01L 33/58
257/E33.059
2008/0151182 A1* 6/2008 Hsu ................... C08J 7/065
351/159.6

(Continued)

FOREIGN PATENT DOCUMENTS

| CN | 110915006 A | 3/2020 |
| JP | 2007-153970 A | 6/2007 |

(Continued)

OTHER PUBLICATIONS

Nov. 16, 2021 International Search Report issued in International Patent Application No. PCT/JP2021/034383.

(Continued)

*Primary Examiner* — Bao Q Truong
(74) *Attorney, Agent, or Firm* — Oliff PLC

(57) ABSTRACT

An ultraviolet LED optical member has high transmittance in an ultraviolet range, is stable even by long-term use and has excellent reliability. The ultraviolet LED optical member exhibits optical characteristics in which the average transmittance at wavelengths from 200 to 300 nm is 50% or more by having an optical member made of an organic resin. The optical member for this ultraviolet LED optical member preferably exhibits optical characteristics in which the transmittance of at least any wavelength from 200 to 250 nm is at least 60%.

13 Claims, 3 Drawing Sheets

(56) References Cited

U.S. PATENT DOCUMENTS

| | | | |
|---|---|---|---|
| 2010/0304133 A1 | 12/2010 | Maeda | |
| 2016/0280860 A1 | 9/2016 | Ogawa | |
| 2021/0305471 A1* | 9/2021 | Shi | ............ C09D 127/12 |

FOREIGN PATENT DOCUMENTS

| | | | | |
|---|---|---|---|---|
| JP | 2009-276511 A | | 11/2009 | |
| JP | 2012-138422 A | | 7/2012 | |
| JP | 2016-183235 A | | 10/2016 | |
| JP | 2016-186063 A | | 10/2016 | |
| JP | 2019-207956 A | | 12/2019 | |
| JP | 2020-009858 A | * | 1/2020 | ............ H01L 33/58 |
| JP | 2020-104462 A | | 7/2020 | |
| JP | 2020-105475 A | | 7/2020 | |
| JP | 2021-520632 A | | 8/2021 | |
| WO | 2009/110152 A1 | | 9/2009 | |
| WO | 2020/102948 | * | 5/2020 | ............ H01L 33/48 |
| WO | 2020/158813 A1 | | 8/2020 | |

OTHER PUBLICATIONS

Aug. 9, 2022 Office Action issued in Japanese Patent Application No. 2022-543614.
Nov. 22, 2021 International Search Report issued in International Patent Application No. PCT/JP2021/034382.
U.S. Appl. No. 18/011,665, filed Dec. 20, 2022 in the name of Masutugu Tasaki et al.
Dec. 1, 2023 Office Action issued in U.S. Appl. No. 18/011,665.
May 23, 2024 Office Action issued in U.S. Appl. No. 18/011,665.
Jul. 7, 2023 Office Action issued in U.S. Appl. No. 18/011,665.
Sep. 11, 2024 Notice of Allowance issued in U.S. Appl. No. 18/011,665.
Dec. 21, 2022 Office Action issued in Japanese Patent Application No. 2022-543564.
Aug. 19, 2022 Office Action issued in Japanese Patent Application No. 2022-543564.

* cited by examiner (a)

(b)

(c)

(d)

(e)

(f)

ULTRAVIOLET LED OPTICAL MEMBER

TECHNICAL FIELD

The present invention relates to an optical member that has high transmittance even in an ultraviolet wavelength range.

BACKGROUND ART

Ultraviolet rays have been utilized in various fields in recent years, and in particular ultraviolet LED (UV-LED) which performs short wavelength ultraviolet irradiation has been developed.

Ultraviolet wavelength ranges are generally classified into UVA (ultraviolet A light: wavelengths from 400 to 315 nm), UVB (ultraviolet B light: wavelengths from 315 to 280 nm) and UVC (ultraviolet C light: wavelengths from 280 to 100 nm). It is known that among the sun's rays, UVC having high energy is absorbed by the ozone layer and does not reach the surface of the earth; however, UVA and UVB reach the surface of the earth, and are useful for e.g. the activation of vitamin D by sunbathing, sterilization when hanging laundry and drying the bedding in the sun, and photosynthesis, but have influence on sunburn, inflammation, blotches, wrinkles, and skin cancer occurrence.

Utilizing such properties of ultraviolet rays, artificial ultraviolet rays have been used for various industrial and daily applications. For example, the wavelength of UVC has been used in the fields of disinfection and sterilization, and water purification and air cleaning, the wavelength of UVB has been used in the fields of medical treatment and agriculture, and the wavelength of UVA has been used in the fields of the curing and adhesion of resin, and printing and painting.

Ultraviolet lamps using mercury as light sources for those ultraviolet rays have been used until now, but have been changed to ultraviolet LED due to e.g. environmental issues and power consumption.

Ultraviolet LED has a narrow emitting wavelength range compared to those of ultraviolet lamp light sources which emit many wavelengths, and can contribute to energy saving due to high electricity efficiency at a certain wavelength. Furthermore, ultraviolet LED has advantages of a quicker lighting speed, no deterioration due to switching on and off of the power, good user-friendliness due to long life and high maintainability, reduced sizes, lightweight and free designs, and no environmental burden by not using mercury and environmental friendliness, and disadvantages of considerably low output compared to that of ultraviolet lamps, and moreover high costs per light quantity.

Therefore, in order to stably improve the light-extraction efficiency of LED devices and LED elements, Patent Document 1 discloses a light-emitting device, including a mounted substrate; a light-emitting element which is arranged on the mounted substrate and emits ultraviolet rays; a frame-shaped spacer which is arranged on the mounted substrate and surrounds the light-emitting element; a cover which is arranged on the spacer so as to cover the light-emitting element and through which ultraviolet rays emitted from the light-emitting element pass; and a lens such as synthetic quartz which is arranged between the light-emitting element and the cover, wherein the lens faces the light-emitting element through only space in the thickness direction of the mounted substrate, and the spacer has a positioning structure to position the lens in a plane in the thickness direction and orthogonal to the thickness direction.

In addition, Patent Document 2 discloses a light-emitting device, having a light source to emit deep ultraviolet light, and a light flux controlling member to control light distribution of the deep ultraviolet light, which is formed from a material having properties of raising the transmittance of the deep ultraviolet light by the deep ultraviolet light irradiation.

PRIOR ART DOCUMENT

Patent Document

[Patent Document 1] JP2019-207956 A
[Patent Document 2] JP2020-9858 A

SUMMARY OF INVENTION

Problem to be Solved by the Invention

As described in Patent Document 1, in an ultraviolet LED device, an optical member is formed mainly from an inorganic material such as synthetic quartz having high transmittance in an ultraviolet range; however, the production method thereof is difficult and the freedom of design is low, and the optical member becomes expensive.

In addition, as described in Patent Document 2, in the disclosed light-emitting device having the light flux controlling member formed from a material having properties of raising the transmittance of deep ultraviolet light, the transmittance in an ultraviolet range, e.g. at wavelengths from 200 to 250 nm is low and insufficient.

The present invention is made to solve the above problems, and an object thereof is to provide an ultraviolet LED optical member that has high transmittance in an ultraviolet range, is stable even by long-term use and has excellent reliability.

Means to Solve the Above Problems

The ultraviolet LED optical member provided to achieve the above object is characterized by exhibiting optical characteristics in which the average transmittance at wavelengths from 200 to 300 nm is 50% or more by having an optical member made of an organic resin.

In the ultraviolet LED optical member, the optical member preferably exhibits optical characteristics in which the transmittance of at least any wavelength from 200 to 250 nm is at least 60%.

In the ultraviolet LED optical member, the organic resin is, for example, a silicone resin or a fluorine resin.

In the ultraviolet LED optical member, the organic resin is preferably a condensation-polymerized silicone resin.

In the ultraviolet LED optical member, the condensation-polymerized silicone resin further preferably has, among an M unit which is a monoorganosiloxy unit, a D unit which is a diorganosiloxy unit, a T unit which is a triorganosiloxy unit, and a Q unit which is a siloxy unit, at least any of the T unit and the D unit.

In the ultraviolet LED optical member, the condensation-polymerized silicone resin is yet further preferably any T unit-containing three-dimensional cross-linked silicone resin selected from a T resin including the T unit, an MTQ resin having a combination of the M unit, the T unit and the Q unit, an MDTQ resin having a combination of the M unit, the D unit, the T unit and the Q unit, a DT resin having a combination of the D unit and the T unit, and a TDQ resin having a combination of the D unit, the T unit and the Q unit.

In the ultraviolet LED optical member, the optical member further preferably exhibits optical characteristics in which the average transmittance at wavelengths from 200 to 300 nm is 70% or more.

In the optical member for the ultraviolet LED optical member, the transmittance of at least any wavelength from 200 to 250 nm is yet further preferably at least 70%.

In the optical member for the ultraviolet LED optical member, any transmittance at wavelengths from 250 to 280 nm is further preferably at least 90%.

In the ultraviolet LED optical member, the optical member may have a maximum thickness of 5 mm.

Examples of the ultraviolet LED optical member include a lens, a lens sheet, a lens array, a film or a light guiding panel including only the optical member made of the organic resin; a coating, or a covering member including the optical member made of the organic resin, which covers at least a part of a formed optical base material made of a resin the same as or different from the organic resin or made of quartz glass; or an encapsulant material for an optical element, made of an organic resin.

In the ultraviolet LED optical member, it is preferred that the organic resin be a condensation-polymerized silicone resin, and not include 0.3 parts by mass or more of a curing catalyst with respect to 100 parts by mass of the condensation-polymerized silicone resin.

In the ultraviolet LED optical member, the optical member may have any modification treated surface of a corona-treated surface, a plasma-treated surface, an ultraviolet-treated surface and a molecular adhesive-treated surface.

In the ultraviolet LED optical member, at least any of joint surface between the formed optical base material and the optical member further preferably has any modification treated surface of a corona-treated surface, a plasma-treated surface and a molecular adhesive-treated surface.

The ultraviolet LED optical member may include the formed optical base material selected from a formed cubic optical base material, a formed rectangular optical base material, a formed spherical optical base material, a formed hemispherical optical base material, a formed prism optical base material, a formed spherical lens optical base material and a formed aspheric lens optical base material, and the optical member which covers at least a part of the formed optical base material.

The ultraviolet LED optical member is preferably used as a lens.

Effects of the Invention

According to the ultraviolet LED optical member of the present invention, it is possible to obtain an optical member, which has formability and in which the average transmittance at wavelengths from 200 to 300 nm in an ultraviolet range is 50% or more and particularly 70% or more by using a condensation-polymerized silicone resin having preferably the D unit and the T unit, or only the T unit.

According to the ultraviolet LED optical member of the present invention, wavelengths from 200 to 300 nm pass through it at high transmittance, and it can be used as a lens, a lens sheet, a lens array, a film or a light guiding panel which collects, scatters, diffuses or guides light. In addition, the ultraviolet LED optical member of the present invention can be also used as a coating, or a covering member which covers a formed optical base material.

EMBODIMENTS TO IMPLEMENT THE INVENTION

Figure 1:
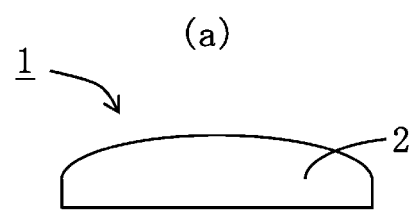
FIG. 1 are schematic views showing examples of the ultraviolet LED optical member to which the present invention is applied.
Figure 1:
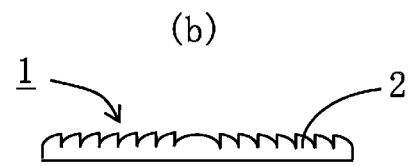
Figure 1:
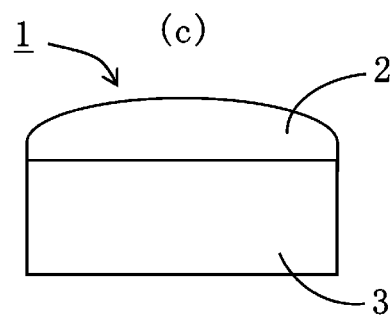
Figure 1:
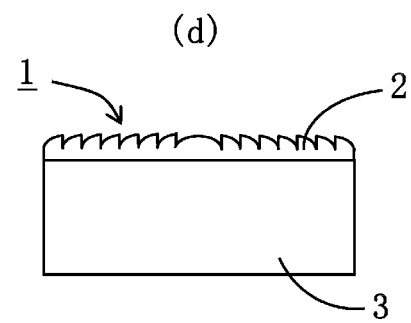
Figure 1:
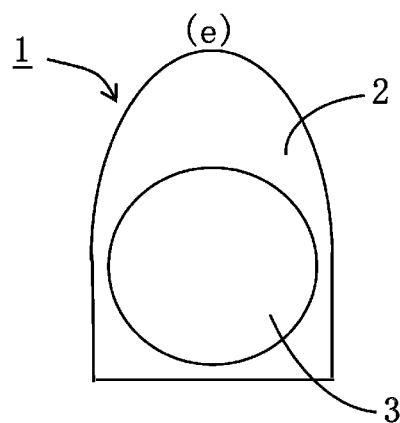
Figure 1:
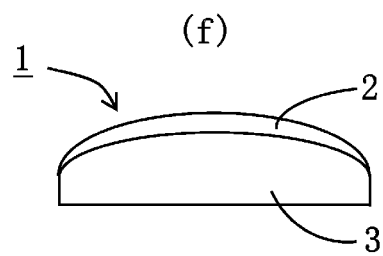

The embodiments of the present invention will now be described in detail. It should be noted, however, that the scope of the present invention is not limited to these embodiments.

The ultraviolet LED optical member of the present invention is an ultraviolet LED optical member having an optical member made of an organic resin, preferably a silicone resin or a fluorine resin, more preferably a condensation-polymerized silicone resin.

In the optical member for the ultraviolet LED optical member, the average transmittance at wavelengths from 200 to 300 nm may be 50% or more, preferably 60% or more, further preferably 70% or more, and yet further preferably 80% or more, and the average transmittance at wavelengths from 200 to 250 nm may be 50% or more, preferably 60% or more, and further preferably 70% or more. In addition, any transmittance at wavelengths from 250 to 280 nm in a thickness of 5 mm is at least 90%.

In the ultraviolet LED optical member, the average transmittance at wavelengths from 200 to 300 nm in an ultraviolet range is only needed to be 50% or more, and the thickness is 0.01 mm at the minimum and 10 mm or less at the maximum, preferably 5 mm at the maximum.

The average transmittance herein indicates the average value of transmittance in a certain wavelength range from 200 to 300 nm or from 200 to 250 nm. For example, the average transmittance may be that obtained by averaging transmittance at intervals of 0.1 nm to 5 nm, preferably 1 nm, in continuous wavelengths, measured by a spectrophotometer.

This ultraviolet LED optical member has the optical characteristics of high transmittance in which the average transmittance at wavelengths from 200 to 300 nm is 50% or more, by using the silicone resin as the base polymer of the optical member such as a condensation-polymerized silicone resin in which among a T unit (trifunctional organosilsesquioxane unit: $R_1SiO_{3/2}$ unit), a D unit (bifunctional diorganosiloxane unit: $R_2SiO_{2/2}$ unit), an M unit (monofunctional triorganosiloxy unit: $R_3SiO_{1/2}$) and a Q unit (tetrafunctional unit: $SiO_{4/2}$) represented by the following formulae (in all units, R is specifically an alkyl group such as a methyl group, or an aryl group such as a phenyl group), the mol ratio of the T unit or the D unit or T·D unit having a combination of the T unit and the D unit is above 50 mol % with respect to the total mol ratio of the T, D, M and Q units, and which has a T unit-repeating structure or D unit-repeating structure or DT structure as the main structure.

[Chemical formula 1]

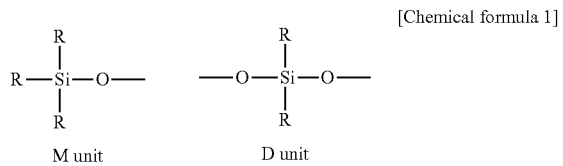

-continued $$-\text{O}-\underset{\underset{\text{R}}{|}}{\overset{\overset{\text{O}}{|}}{\text{Si}}}-\text{O}-$$

T unit $$-\text{O}-\underset{\underset{\text{O}}{|}}{\overset{\overset{\text{O}}{|}}{\text{Si}}}-\text{O}-$$

Q unit

Alternatively, this ultraviolet LED optical member has the optical characteristics of high transmittance in which the average transmittance at wavelengths from 200 to 300 nm is 50% or more, when such fluorine resin as the base polymer of the optical member is a fluorine resin which has an amorphous structure.

Silicone rubber or silicone resin generally has low transmittance in an ultraviolet range (in particular UV-B and UV-C), and has not been used as an optical member for ultraviolet LED.

Meanwhile, a silicone resin including only the Q structure has a structure close to so-called a glass structure and has high mechanical strength, but is difficult to form as a resin.

In contrast, unlike quartz glass and synthetic quartz glass, an ultraviolet LED optical member including, as the base resin, a T unit-containing three-dimensional cross-linked silicone resin, which has a T unit-repeating structure and also mainly includes any T unit selected from a T resin having the T unit, a MTQ resin having a combination of the M unit, the T unit and the Q unit, a MDTQ resin having a combination of the M unit, the D unit, the T unit and the Q unit, a DT resin having a combination of the D unit and the T unit, and a TDQ resin having a combination of the D unit, the T unit and the Q unit, preferably a three-dimensional cross-linked silicone resin having the DT resin, has excellent formability and transparency.

In addition, a MQ resin formed from the M unit and the Q unit is very strong and thus has good mechanical strength; however, a coating is brittle and it is thus difficult to form not only a self-supported film but also a three-dimensional form. Meanwhile, in the T resin, the MTQ resin, the MDTQ resin, the DT resin, the TQ resin and the TDQ resin, the flexibility of the coating is improved compared to that of the MQ resin, and not only a strong self-supported film having followability but also a three-dimensional form can be formed, which have strength derived from a resin.

The base material of the optical member includes an organic resin, preferably a silicone resin or a fluorine resin, more preferably a curing silicone resin such as a condensation-polymerized silicone resin. And a branched structure (T unit or Q unit) thereof is 60% or more and shore D hardness thereof after being cured is 40 to 95, preferably 45 to 90, and more preferably 50 to 85, the above certain optical characteristics are exhibited.

The base material of the optical member is a silicone resin formed from only the T structure (the rate of the T unit is 100%), or a silicone resin in which the DT structure is included as the main structure, and the rate of the T unit to the D unit is preferably 70% to 99%, more preferably 80% to 99%, and yet further preferably 90% to 99%.

In particular, the base material of the optical member is a condensation-polymerized silicone resin. And particularly when an optical member is formed using a silicone resin, which is formed from the DT structure and has a high rate of the T unit, both high transmittance in an ultraviolet range and formability can be obtained compared to optical members formed using other silicone rubbers and silicone resins such as an addition-polymerized silicone resin and an addition-polymerized silicone rubber, and a radical-polymerized silicone resin and a radical-polymerized silicone rubber. In this case, the rate of the T unit to the D unit is preferably 70% to 99%, more preferably 80% to 99%, and yet further preferably 90% to 99%. In addition, both high transmittance in an ultraviolet range and formability can be obtained even from a silicone resin formed from only the T structure. As described above, one factor that the ultraviolet LED optical member exhibits the above certain optical characteristics is that the optical member may have the T unit as the main structure.

Organic functional groups having a Si—C bond, such as some alkyl groups bound to the D unit and/or the T unit, are eliminated by e.g. energy irradiation treatment, and the Q structure and/or a glass structure (Si=O structure or Si—OH structure) is obtained. Consequently, the Si group becomes inorganic to modify or remove and reduce e.g. the Si—C bond, which is considered to be a factor to absorb wavelengths in an ultraviolet range. Therefore, the ultraviolet LED optical member having an optical member including such condensation-polymerized silicone resin is presumed to be able to have high transmittance even in an ultraviolet range. Accordingly, an optical member having stable characteristics in which high transmittance in a visible range and also high transmittance in an ultraviolet range are maintained can be obtained. As described above, one factor that the ultraviolet LED optical member exhibits the above certain optical characteristics is that the optical member preferably includes a condensation-polymerized silicone resin which does not have an addition-polymerizable functional group such as a vinyl group.

The raw material silicone resin composition used to form the optical member in the ultraviolet LED optical member includes preferably a condensation-polymerizable silicone resin which can be cured by condensation, from the viewpoint of removing factors to absorb ultraviolet rays such as C—C bond and C=C bond in the structure formula of addition-polymerized silicone.

More specifically, examples thereof include polyorganosiloxane (silicone resin) having a siloxane bond of Si—O—Si on the main skeleton, which is the main chain, as shown in the following chemical formulae. In the following chemical formulae, X is an organic functional group such as a monovalent unsubstituted or substituted hydrocarbon group not including an aliphatic unsaturated group. Examples of X include a hydroxy group; alkyl groups such as a methyl group, an ethyl group, a propyl group, a pentyl group, a butyl group, a pentyl group and a hexyl group; aryl groups such as a tolyl group and a xylyl group; substituted hydrocarbon groups such as a chloromethyl group, a 3-chloropropyl group and a 3-trifluoropropyl group. At this time, when X is a phenyl group, it is preferred to remove the phenyl group because the phenyl group reduces transmittance in an ultraviolet range. X may be one type or a plurality of types. In addition, a large portion of X or all X is preferably a methyl group. O—R represents an alkoxysilyl group.

[Chemical formula 2]

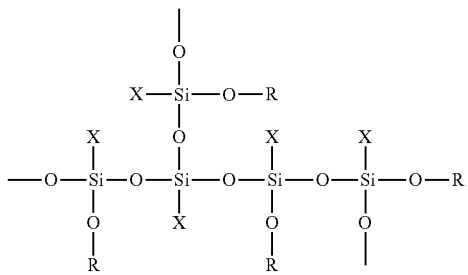

[Chemical formula 3]

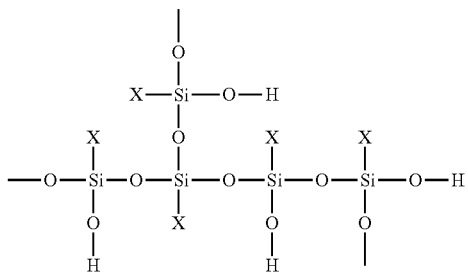

(wherein, —O—R is an alkoxysilyl group, and —X is an organic functional group such as a methyl group.)

It is preferred that such condensation-polymerized silicone resin as a raw material does not include a metal catalyst such as a platinum-containing catalyst, a lead-containing catalyst, a titanium-containing catalyst or an aluminum-containing catalyst, which exhibits absorption characteristics at wavelengths from 200 to 300 nm, a phosphoric acid catalyst, an amine-based catalyst, particularly an organic curing catalyst including an organic compound and/or an inorganic curing catalyst in 0.3 parts by mass or more, preferably 0.2 parts by mass or more, and more preferably 0.1 parts by mass or more with respect to 100 parts by mass of the silicone resin. By doing this, factors that the curing catalyst such as a metal catalyst absorbs ultraviolet rays can be reduced or removed, and thus the ultraviolet LED optical member can raise the average transmittance at wavelengths from 200 to 300 nm.

Meanwhile, examples of the amorphous fluorine resin include amorphous fluorine resins "CYTOP" (product name manufactured by AGC Inc.) having a repeating structure as shown in the following chemical formula by cyclic polymerization of perfluoro(4-vinyloxy-1-butene), and specific examples thereof include CYTOP A type (terminal functional group: —COOH), M type (terminal functional group: —CONH—Si(OR)$_n$), and S type (terminal functional group: —CF$_3$) (all types are manufactured by the same company).

[Chemical formula 4]

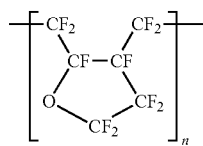

(wherein, n is the number of repeating units in fluorine resin.)

In addition, the ultraviolet LED optical member, particularly the optical member, can be formed into a film or plate with a maximum thickness of 10 mm or less, preferably a maximum thickness of 5 mm or less, or a three-dimensional form by polymerization into a three-dimensional cross-linked silicone resin by liquid injection molding system (LIMS), die molding, stamp molding using e.g. pressing dies and a roller, or coating such as spraying or application, regardless of the type of raw material, the form of the ultraviolet LED optical member, and irregularities on the surface, the degree of smoothness, or size, hardness and thickness.

In such ultraviolet LED optical member, the optical member is not particularly limited as long as the optical member is made of the condensed silicone resin and has the optical characteristics. The ultraviolet LED optical member 1 may include only the optical member 2, and may be, as shown in FIGS. 1(a) and (b), a lens, e.g. a convex lens such as a biconvex lens, a plano-convex lens (see FIG. 1(a)), or a convex meniscus lens; a concave lens such as a biconcave lens, a plano-concave lens, a concave meniscus lens; an aspheric lens; a cylindrical lens (see FIG. 1(b)); a toroidal lens; or a Fresnel lens, may be a lens sheet obtained by forming the above forms in a sheet form, may be a lens array obtained by arranging a lot of the lenses, may be a film or may be a light guiding panel.

The ultraviolet LED optical member can adhere to e.g. a LED device, an optical base material, a substrate, a glass surface, an LED element, and another formed optical member by modifying the surface thereof using any of corona treatment, plasma treatment and a molecular adhesive treatment, or by an adhesive.

When the ultraviolet LED optical member is a lens, it can collect, scatter, diffuse or guide light from ultraviolet LED, and light intensity on a site irradiated with light, and an area irradiated with light can be adjusted. The light from ultraviolet LED at this time may have an ultraviolet LED peak wavelength of 200 to 360 nm, preferably 200 to 300 nm, and more preferably 220 to 280 nm. The peak wavelength herein indicates a wavelength having the highest intensity.

In addition, the ultraviolet LED optical member may also cover a formed optical base material, made of a resin the same as or different from the silicone resin, or made of quartz glass, and may be specifically a hybrid lens, in which the formed optical base material is covered with a coating, or a covering member made of the silicone resin, e.g. a coating layer or a pearskin covering layer, or a light-collecting or light-diffusing covering member.

That is, the ultraviolet LED optical member may be formed using the condensed silicone resin, but may be combined for example by, on a formed optical base material using a three-dimensional or plate member having characteristics of high transmittance as a support even in an ultraviolet range such as quartz glass, the adhesion or bonding of the optical member made of the organic resin and quartz glass; by coating the organic resin on quartz glass and then forming it; or by the molecular adhesion of the optical member made of the organic resin and quartz glass, and an ultraviolet LED optical member with a thickness of 10 mm or more can be also obtained.

Specifically, examples of the ultraviolet LED optical member include a hybrid lens including the formed optical base material selected from a formed cubic optical base material, a formed rectangular optical base material, a formed spherical optical base material, a formed hemispherical optical base material, a formed prism optical base material, a formed spherical lens optical base material, and a formed aspheric lens optical base material, and the optical member which covers at least a part of the formed optical base material.

More specifically, the ultraviolet LED optical member 1 may be a hybrid lens in which the optical member 2 such as a plano-convex lens or Fresnel lens covers the formed cubic or rectangular optical substrate 3 made of quartz glass as shown in FIGS. 1(c) and (d), a hybrid lens in which the optical member 2 covers the periphery of the formed optical base material 3 of spherical quartz glass so that the lower side will be a rectangular form and the upper side will be a convex meniscus lens while forming along the upper hemisphere of the formed spherical optical base material 3 as shown in FIG. 1(e), or a hybrid lens in which the film-shaped optical member 2 covers the formed optical base material 3, which is a hemisphere lens, a convex lens, a concave lens, an aspheric lens, a cylindrical lens, a toroidal lens or a Fresnel lens (a plano-convex lens as a typical example in FIG. 1(f)), along the surface thereof as shown in FIG. 1(f).

As long as the ultraviolet LED optical member meets the transmittance, it may include organic or inorganic filler having properties of light diffusion, wavelength conversion and heat conduction, and may include separately a layer.

The ultraviolet LED optical member may be treated with energy irradiation after forming the optical member, preferably treated with ultraviolet irradiation, for example may be irradiated with ultraviolet rays at a wavelength of 360 nm or less, preferably from 200 to 360 nm, and more preferably from 260 to 300 nm. The irradiation energy of ultraviolet rays at this time is 0.04 kJ/cm² or more, preferably 0.12 kJ/cm² or more, more preferably 0.21 kJ/cm² or more, and when it is 5 kJ/cm² or more, 40 kJ/cm² or more, 80 kJ/cm² or more or 120 kJ/cm² or more, the transmittance in an ultraviolet range can be improved. The irradiation energy is calculated by the following formula:

$$\text{Irradiation energy [kJ/cm}^2\text{]=irradiation intensity [mW/cm}^2\text{]}\times\text{irradiation time [s].}$$

Embodiments

An ultraviolet LED optical member, to which the present invention is applied, and an ultraviolet LED optical member, to which the present invention is not applied, were produced and compared.

Example 1

Using a silicone resin in a white solid state (flake state) in which all organic functional groups are methyl groups (product number YR3370 manufactured by Momentive Performance Materials) as a raw material for an optical member in an ultraviolet LED optical member in Example 1, a test sample of the ultraviolet LED optical member was produced.

The method for forming the test sample is as follows.

The raw material (YR3370) of 4 g was measured, put in a round flat die and cured by heating to obtain the test sample in Example 1 with a thickness of 1 to 2 mm.

Example 2

Using s silicone resin in a white solid state (flake state) in which all organic functional groups are methyl groups (product number YR3370 manufactured by Momentive Performance Materials) as a raw material for an optical member in an ultraviolet LED optical member in Example 2, a test sample of the ultraviolet LED optical member was produced.

The method for forming the test sample is as follows.

The raw material (YR3370) of 10 g was measured, put in a round flat die and cured by heating to obtain the test sample in Example 2 with a thickness of 5 mm.

Example 3

Using an amorphous fluorine resin (product number CTX-809SP2 manufactured by AGC Inc.) as a raw material for an optical member in an ultraviolet LED optical member in Example 3, a test sample of the ultraviolet LED optical member was produced.

The method for forming the test sample is as follows.

The raw material (CTX-809SP2) of 1 g was measured, put in a flat die and cured by heating to obtain the test sample in Example 3 with a thickness of 0.05 mm.

Example 4

Using a silicone resin in a white solid state (flake state) which is a condensation-polymerized silicone resin and in which all organic functional groups are methyl groups (product number YR3370 manufactured by Momentive Performance Materials) as a raw material for an optical member in an ultraviolet LED optical member in Example 4, a test sample of the ultraviolet LED optical member was produced.

The method for forming the test sample is as follows.

The raw material (YR3370) of 20 g was measured, put in a round flat die and cured by heating to obtain the test sample in Example 4 with a thickness of 9.5 mm.

Comparative Example

Using a commercial addition-polymerizable silicone resin (product name MS1001 manufactured by Dow Toray Co., Ltd.), which has excellent durability, can be produced into a fine form, is a two-part type of medium viscosity and medium hardness in a mix ratio of 1:1, and is for fast curing optical forming, in place of silicone resin YR3370 in Example 1, as a raw material for an optical member in an ultraviolet LED optical member in Comparative Example, the silicone resin of 4 g was measured, put in a round flat die, and cured by heating to obtain the test sample in Comparative Example with a thickness of 1 to 2 mm.

(Measurement of Transmittance)

The transmittance at wavelengths from 200 to 800 nm of the test samples in Examples 1 to 2 and Comparative Example was measured using a spectrophotometer UV-3600 Plus and an integrating sphere unit (product number ISR-1503 manufactured by SHIMADZU CORPORATION).

The results of transmittance measurement are shown in Table 1 below and FIGS. 2 to 3.

Figure 2:
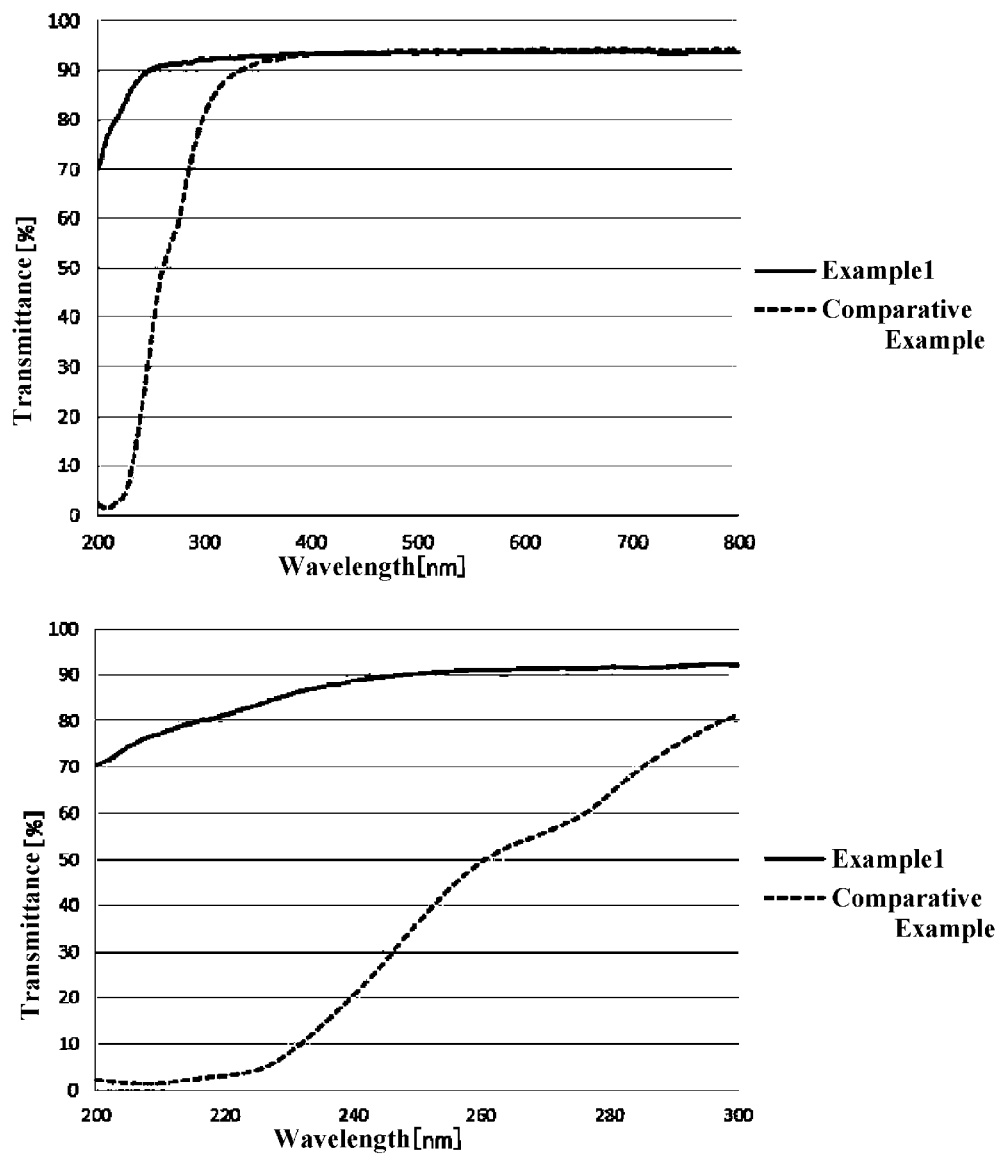
FIG. 2 are graphs showing transmittance at wavelengths from 200 to 800 nm, which are test results in the transparency evaluation of an ultraviolet LED optical member to which the present invention is applied, and an ultraviolet LED optical member to which the present invention is not applied.
Figure 3:
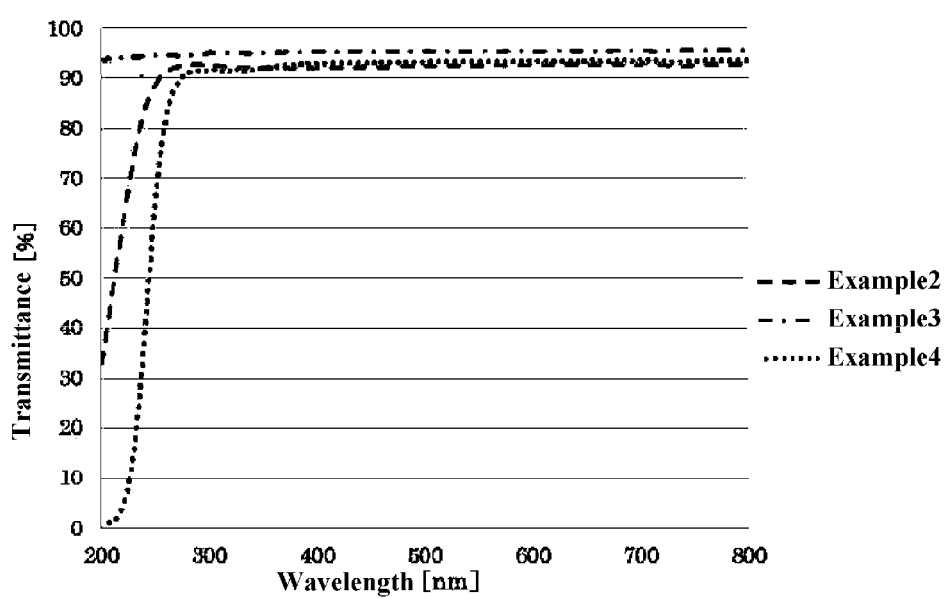
FIG. 3 is a graph showing transmittance at wavelengths from 200 to 800 nm, which is test results in the transparency evaluation of another ultraviolet LED optical member to which the present invention is applied.

As shown in Table 1 and FIGS. 2 to 3, it was found that in the optical member including the condensation-polymerized silicone resin in Example 1, the average transmittance at wavelengths from 200 to 300 nm in a deep ultraviolet range was high, 80% or more, and even the average transmittance at wavelengths from 200 to 250 nm was high, 80% or more. It was found that in the optical member including the condensation-polymerized silicone resin in Example 2, the average transmittance at wavelengths from 200 to 300 nm in a deep ultraviolet range was high, and 78% or more, and even the average transmittance at wavelengths from 200 to 250 nm was high, and 65% or more. The optical member including the amorphous fluorine resin in Example 3 had a high transmittance of about 90% or more even in a deep ultraviolet range. In the optical member including the condensation-polymerized silicone resin in Example 4, the average transmittance at wavelengths from 200 to 300 nm in a deep ultraviolet range was 50% or more, and particularly the transmittance at a wavelength of 280 nm was 90% or more. However, in the optical member including the addition-polymerized silicone resin in Comparative Example, the average transmittance at wavelengths from 200 to 300 nm in a deep ultraviolet range was low, and about 30%, and the average transmittance at wavelengths from 200 to 250 nm was very low, and about 10%.

TABLE 1

|  | Average transmittance [%] | |
| --- | --- | --- |
|  | 200 to 300 [nm] | 200 to 250 [nm] |
| Example 1 (Condensation-polymerized silicone resin) | 87.02 | 82.73 |
| Example 2 (Condensation-polymerized silicone resin) | 78.59 | 65.43 |
| Example 3 (Amorphous fluorine resin) | 94.46 | 94.20 |
| Example 4 (Condensation-polymerized silicone resin) | 53.20 | 19.38 |
| Comparative Example (Addition-polymerized silicone resin) | 35.44 | 10.27 |

As shown in Table 1 and FIGS. 2 to 3, the optical members including a condensation-polymerized silicone resin could have high transmittance from a wavelength of 800 nm in an infrared range to 200 nm in a deep ultraviolet range. Therefore, an ultraviolet LED optical member, which has high transmittance even in an ultraviolet range like quartz glass, good formability and low costs, can be obtained.

INDUSTRIAL APPLICABILITY

The ultraviolet LED optical member of the present invention can be used as an optical member in the fields of disinfection and sterilization, and water purification and air cleaning, which need high transmittance in an ultraviolet wavelength range, particularly a deep ultraviolet range, and/or as an optical member in the optical field, which collects, scatters, diffuses or guides light at wavelengths in an ultraviolet, particularly deep ultraviolet range, and which improves the light-extraction efficiency of light-emitting elements. In addition, an ultraviolet LED optical member, which has good formability, low costs, and high transmittance in an ultraviolet range like quartz glass, can be obtained.

EXPLANATIONS OF LETTERS OR NUMERALS

1: ultraviolet LED optical member, 2: optical member, 3: formed optical base material.

What is claimed is:

1. An ultraviolet LED optical member, exhibiting optical characteristics of which an average transmittance at wavelengths from 200 to 300 nm is 50% or more by having an optical member made of an organic resin, wherein:
the organic resin is a condensation-polymerized silicone resin, and
the condensation-polymerized silicone resin has, among an M unit which is a monoorganosiloxy unit, a D unit which is a diorganosiloxy unit, a T unit which is a triorganosiloxy unit and a Q unit which is a siloxy unit, at least any of the T unit and the D unit.

2. The ultraviolet LED optical member according to claim 1, wherein the optical member exhibits optical characteristics of which a transmittance of at least any wavelength from 200 to 250 nm is at least 60%.

3. The ultraviolet LED optical member according to claim 1, wherein the condensation-polymerized silicone resin is any T unit-containing three-dimensional cross-linked silicone resin selected from a T resin comprising the T unit, an MTQ resin having a combination of the M unit, the T unit and the Q unit, an MDTQ resin having a combination of the M unit, the D unit, the T unit and the Q unit, a DT resin having a combination of the D unit and the T unit, and a TDQ resin having a combination of the D unit, the T unit and the Q unit.

4. The ultraviolet LED optical member according to claim 1, wherein the optical member exhibits optical characteristics of which the average transmittance at wavelengths from 200 to 300 nm is 70% or more.

5. The ultraviolet LED optical member according to claim 2, wherein the transmittance of at least any wavelength from 200 to 250 nm is at least 70% in the optical member.

6. The ultraviolet LED optical member according to claim 1, wherein any transmittance at wavelengths from 250 to 280 nm is at least 90% in the optical member.

7. The ultraviolet LED optical member according to claim 1, wherein the optical member has a maximum thickness of 5 mm.

8. The ultraviolet LED optical member according to claim 1, which is a lens, a lens sheet, a lens array, a film or a light guiding panel comprising only the optical member made of the organic resin;
a coating, or a covering member comprising the optical member made of the organic resin, which covers at least a part of a formed optical base material made of a resin of a same as or different from the organic resin, or made of quartz glass; or
an encapsulant material for an optical element, made of an organic resin.

9. The ultraviolet LED optical member according to claim 1, wherein the organic resin is the condensation-polymerized silicone resin and does not comprise 0.3 parts by mass or more of a curing catalyst with respect to 100 parts by mass of the condensation-polymerized silicone resin.

10. The ultraviolet LED optical member according to claim 1, wherein the optical member has any modification treated surface of a corona-treated surface, a plasma-treated surface, an ultraviolet-treated surface and a molecular adhesive-treated surface.

11. The ultraviolet LED optical member according to claim 8, wherein at least any of joint surface between the formed optical base material and the optical member has any modification treated surface of a corona-treated surface, a plasma-treated surface and a molecular adhesive-treated surface.

12. The ultraviolet LED optical member according to claim 8, comprising the formed optical base material selected from a formed cubic optical base material, a formed rectangular optical base material, a formed spherical optical base material, a formed hemispherical optical base material, a formed prism optical base material, a formed spherical lens optical base material and a formed aspheric lens optical base material, and the optical member which covers at least a part of the formed optical base material.

13. The ultraviolet LED optical member according to claim 9, which is a lens.

\* \* \* \* \*